United States Patent
Tsoi et al.

(10) Patent No.: US 9,423,192 B2
(45) Date of Patent: Aug. 23, 2016

(54) HEAT SPREADING DEVICE AND METHOD WITH SECTIONING FORMING MULTIPLE CHAMBERS

(75) Inventors: Vadim Tsoi, Kista (SE); Uno Henningsson, Kista (SE); Yuping Hong, Shenzhen (CN); Feng Peng, Shanghai (CN); Hua Yang, Shanghai (CN); Haipeng Li, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/299,431

(22) Filed: Nov. 18, 2011

(65) Prior Publication Data

US 2012/0111553 A1     May 10, 2012

Related U.S. Application Data

(63) Continuation of application No. PCT/IB2010/001351, filed on May 18, 2010.

(30) Foreign Application Priority Data

May 18, 2009    (SE) ...................................... 0900622

(51) Int. Cl.
*F28F 7/00*          (2006.01)
*F24H 9/02*         (2006.01)
*F28F 21/08*        (2006.01)
(Continued)

(52) U.S. Cl.
CPC .......... *F28F 21/084* (2013.01); *F28D 15/0233* (2013.01); *H01L 23/427* (2013.01); *F28D 15/0283* (2013.01); *H01L 2924/0002* (2013.01); *Y10T 29/4935* (2015.01)

(58) Field of Classification Search
CPC .............. F28F 21/084; F28D 15/0233; F28D 15/0283; H01L 23/427; H01L 2924/0002
USPC ............. 165/80.2, 80.3, 80.4, 80.5, 130, 131, 165/104.21, 104.26, 104.33, 166, 170, 185, 165/129; 361/699, 700; 29/890.03, 29/890.032, 890.035
See application file for complete search history.

(56) References Cited

U.S. PATENT DOCUMENTS 2,064,141 A * 12/1936 Askin ...................... 29/890.035
2,877,000 A * 3/1959 Person .......................... 165/166
(Continued)

FOREIGN PATENT DOCUMENTS

CN          1936481 A     3/2007
EP          1 048 916 A2    11/2000
(Continued)

OTHER PUBLICATIONS

International Search Report from the Chinese Patent Office in International Application No. PCT/IB2010/001351 mailed Oct. 21, 2010.
(Continued)

*Primary Examiner* — Ljiljana Ciric
(74) *Attorney, Agent, or Firm* — Conley Rose, P.C.; Grant Rodolph; Nicholas K. Beaulieu

(57) ABSTRACT

A heat spreading device includes sectioning forming a first chamber portion and a second chamber portion, a first plurality of conduits, and a second at least two conduits. The second at least two conduits interconnect the first chamber portion and the second chamber portion. The heat spreading device may also include cavities, a barrier, and fins.

20 Claims, 7 Drawing Sheets

(51) Int. Cl.
*F28D 15/02* (2006.01)
*H01L 23/427* (2006.01)

(56) References Cited

U.S. PATENT DOCUMENTS

| | | | | |
|---|---|---|---|---|
| 3,035,419 A * | 5/1962 | Wigert | | 165/104.33 |
| 3,053,514 A * | 9/1962 | Grenell | | 165/170 |
| 3,209,062 A * | 9/1965 | Scholz | | 165/80.3 |
| 3,226,602 A * | 12/1965 | Elfving | | 361/700 |
| 3,651,865 A * | 3/1972 | Feldmanis | | 165/80.4 |
| 3,831,664 A * | 8/1974 | Pogson | | 165/80.5 |
| 4,002,200 A * | 1/1977 | Raskin | | 165/170 |
| 4,118,756 A * | 10/1978 | Nelson et al. | | 361/700 |
| 4,180,127 A * | 12/1979 | Maxson | | F28D 15/0275 165/104.21 |
| 4,209,064 A * | 6/1980 | Cacalloro et al. | | 165/104.33 |
| 4,235,287 A * | 11/1980 | Kleine et al. | | 165/170 |
| 4,450,472 A * | 5/1984 | Tuckerman et al. | | 165/80.4 |
| 4,550,774 A * | 11/1985 | Andres et al. | | 165/104.21 |
| 4,758,926 A * | 7/1988 | Herrell et al. | | 361/699 |
| 4,766,885 A * | 8/1988 | Muramatsu | | 165/104.21 |
| 4,796,692 A * | 1/1989 | Szucs et al. | | 165/129 |
| 5,076,350 A * | 12/1991 | Grantz et al. | | 165/104.21 |
| 5,076,351 A * | 12/1991 | Munekawa et al. | | 165/104.21 |
| 5,179,500 A * | 1/1993 | Koubek et al. | | 361/700 |
| 5,238,056 A * | 8/1993 | Scotti et al. | | 165/109.1 |
| 5,309,319 A * | 5/1994 | Messina | | 361/699 |
| 5,327,734 A | 7/1994 | Haynes et al. | | |
| 5,427,174 A * | 6/1995 | Lomolino et al. | | 165/104.26 |
| 5,441,102 A * | 8/1995 | Burward-Hoy | | 165/104.33 |
| 5,642,775 A * | 7/1997 | Akachi | | 165/104.21 |
| 5,697,428 A * | 12/1997 | Akachi | | 165/104.21 |
| 5,725,049 A * | 3/1998 | Swanson et al. | | 165/104.26 |
| 5,731,954 A * | 3/1998 | Cheon | | 361/699 |
| 5,755,278 A * | 5/1998 | Shinohara et al. | | 165/104.33 |
| 5,859,763 A | 1/1999 | Nam et al. | | |
| 5,998,240 A * | 12/1999 | Hamilton et al. | | 438/122 |
| 6,097,597 A * | 8/2000 | Kobayashi | | 165/104.33 |
| 6,158,502 A * | 12/2000 | Thomas | | 165/185 |
| 6,164,368 A * | 12/2000 | Furukawa et al. | | 165/104.33 |
| 6,167,948 B1 * | 1/2001 | Thomas | | 165/104.26 |
| 6,230,788 B1 | 5/2001 | Choo et al. | | |
| 6,234,242 B1 * | 5/2001 | Sehmbey | | F28D 15/0233 165/104.26 |
| 6,257,320 B1 * | 7/2001 | Wargo | | 165/80.4 |
| 6,293,332 B2 * | 9/2001 | Li | | 165/104.26 |
| 6,443,222 B1 | 9/2002 | Yun et al. | | |
| 6,474,074 B2 * | 11/2002 | Ghoshal | | 165/104.21 |
| 6,529,377 B1 * | 3/2003 | Nelson et al. | | 361/699 |
| 6,648,064 B1 * | 11/2003 | Hanson | | 165/104.33 |
| 6,679,316 B1 * | 1/2004 | Lin et al. | | 165/104.26 |
| 6,698,503 B2 * | 3/2004 | Son | | F28D 15/043 165/104.26 |
| 6,935,411 B2 * | 8/2005 | Valenzuela | | 165/80.4 |
| 6,942,019 B2 * | 9/2005 | Pikovsky et al. | | 165/80.4 |
| 6,969,506 B2 * | 11/2005 | Tonkovich et al. | | 423/652 |
| 7,000,686 B2 * | 2/2006 | Makino et al. | | 165/104.26 |
| 7,002,802 B2 | 2/2006 | Ohmi et al. | | |
| 7,025,124 B2 * | 4/2006 | Wang et al. | | 165/104.21 |
| 7,061,763 B2 | 6/2006 | Tsoi | | |
| 7,080,680 B2 * | 7/2006 | Ota et al. | | 165/80.2 |
| 7,110,258 B2 * | 9/2006 | Ding et al. | | 361/699 |
| 7,184,265 B2 * | 2/2007 | Kim et al. | | 165/104.33 |
| 7,190,580 B2 * | 3/2007 | Bezama et al. | | 361/699 |
| 7,231,961 B2 | 6/2007 | Alex et al. | | |
| 7,249,627 B2 * | 7/2007 | Choi | | F28D 15/0233 165/104.21 |
| 7,372,697 B2 * | 5/2008 | Tomioka | | 165/80.4 |
| 7,417,857 B2 * | 8/2008 | Rondier et al. | | 361/699 |
| 7,694,725 B2 * | 4/2010 | Chang | | 165/104.21 |
| 7,836,597 B2 * | 11/2010 | Datta et al. | | 165/104.33 |
| 7,958,934 B2 * | 6/2011 | Nara | | F28F 3/12 165/80.4 |
| 8,157,001 B2 * | 4/2012 | Hom et al. | | 165/80.2 |
| 8,464,781 B2 * | 6/2013 | Kenny et al. | | 165/80.4 |
| 8,490,683 B2 * | 7/2013 | Moon et al. | | 165/104.26 |
| 8,505,617 B2 * | 8/2013 | Bezama et al. | | 165/80.4 |
| 8,561,673 B2 * | 10/2013 | Schuette | | 165/104.33 |
| 8,785,024 B2 * | 7/2014 | Han et al. | | 165/104.26 |
| 8,792,240 B2 * | 7/2014 | Feng et al. | | 165/104.21 |
| 8,797,741 B2 * | 8/2014 | Altman | | 165/104.33 |
| 8,810,448 B1 * | 8/2014 | Ellsworth et al. | | 361/699 |
| 8,833,438 B2 * | 9/2014 | Wyatt et al. | | 165/80.4 |
| 8,863,543 B2 * | 10/2014 | Heckenberger et al. | | 165/170 |
| 8,973,646 B2 * | 3/2015 | Chang | | F28D 15/0233 165/104.21 |
| 2003/0043544 A1 * | 3/2003 | Nelson et al. | | 165/104.33 |
| 2003/0150599 A1 * | 8/2003 | Suzuki | | F28D 15/0266 165/104.21 |
| 2004/0040696 A1 * | 3/2004 | Cho | | F28D 15/0233 165/104.26 |
| 2004/0065111 A1 | 4/2004 | Monfarad | | |
| 2005/0157452 A1 | 7/2005 | Ohmi et al. | | |
| 2006/0157227 A1 * | 7/2006 | Choi | | B82Y 30/00 165/104.21 |
| 2006/0225867 A1 | 10/2006 | Park et al. | | |
| 2007/0034356 A1 * | 2/2007 | Kenny et al. | | 165/80.4 |
| 2007/0068654 A1 | 3/2007 | Chang | | |
| 2007/0079622 A1 | 4/2007 | Bradley et al. | | |
| 2007/0177353 A1 * | 8/2007 | Li | | F28D 15/0283 361/700 |
| 2007/0242438 A1 | 10/2007 | Belits et al. | | |
| 2008/0115416 A1 | 5/2008 | Clark | | |
| 2008/0115528 A1 | 5/2008 | Yamamotoi et al. | | |
| 2008/0148755 A1 | 6/2008 | Fujii et al. | | |
| 2008/0169093 A1 | 7/2008 | Ohfune et al. | | |
| 2010/0326644 A1 * | 12/2010 | Hung | | F28D 15/0233 165/185 |
| 2013/0146273 A1 * | 6/2013 | Chester et al. | | 165/104.33 |
| 2014/0026577 A1 * | 1/2014 | Reinke et al. | | 165/166 |
| 2014/0165399 A1 * | 6/2014 | Seo et al. | | 29/890.03 |

FOREIGN PATENT DOCUMENTS

| | | |
|---|---|---|
| GB | 2 379 973 B | 12/2004 |
| JP | 2004-108760 A | 4/2004 |
| WO | WO 82/03457 | 10/1982 |
| WO | WO 2008/091027 A2 | 7/2008 |

OTHER PUBLICATIONS

Written Opinion of the International Searching Authority from the Chinese Patent Office in International Application No. PCT/IB2010/001351 mailed Oct. 21, 2010.

Extended European Search Report mailed Apr. 17, 2012, for European Patent Application No. 10791694.2.

* cited by examiner

HEAT SPREADING DEVICE AND METHOD WITH SECTIONING FORMING MULTIPLE CHAMBERS

CROSS-REFERENCE TO RELATED APPLICATIONS

This application is a continuation of International Application No. PCT/IB2010/001351, filed on May 18, 2010, which claims priority to Swedish Patent Application No. SE0900622-2, filed on May 18, 2009, both of which are hereby incorporated by reference in their entireties.

FIELD OF THE INVENTION

The present invention relates to a heat spreading device of thermo siphon and a method for manufacturing such a device.

BACKGROUND OF THE INVENTION

Thermo siphons are well known and used in many different cooling applications. One of these applications is to use a thermo siphon for the cooling of electronic equipment. Since a thermo siphon is a very effective cooling device that requires very, little or even no maintenance it is very useful in applications where the heat load source is isolated and not easily reached. One such application is in telecommunications where radio remote units in wireless telecommunication solutions require high radio capacity which means that these units also becomes a heat load that requires cooling. In these radio remote units more than 60% of the heat load comes from power amplifier components. To keep the hot spots temperature on an acceptable level requires high efficient cooling.

Examples of different thermo siphon configurations for cooling electronic components can be found in patent publications, e.g. US 2007/0242438, U.S. Pat. No. 5,859,763, and U.S. Pat. No. 6,097,597.

U.S. Pat. No. 6,230,788 provides an example showing a thermo siphon based on a channel with heat fins mounted on the channel. Heat from a hot place transfers to upper part of equipments via thermo siphon channels and is distributed to the number of heat fins, where all fins together build up a heat sink.

Japanese Patent Application JP200091482 illustrates (in machine translation) a condenser for semiconductor devices. A member partitions a boiling part and a condensing part and joins a steam passage composition and a refrigerant passage composition. Natural circulation is used and one way is made to circulate through a refrigerant. An optional large-sized fin is attached in modules by screws to the condensing part after heat-conduction grease has been applied. The thermal contact resistance is reduced by dividing the large-sized fin into a plurality of smaller ones.

PCT International Application WO2005088714 demonstrates a cold plate and method of making the same. One or more interior fins or flow channels are machined into the interior (as mounted) of the basic and/or the cover member. The cold plate has a base member and a cover member connected thereto by friction stir welding.

PCT International Application WO2004106822 describes a thin-plate-type cooling device of heat of an external heat source contacting a cooling device is dissipated using the latent heat during phase transition. The cooling device relies upon capillary action for the circulation of the coolant. In case there are gas bubbles in the coolant liquid state reaching an evaporation section, there is a concern that the dry-out phenomenon by which the coolant in the liquid state is exhausted occurs in the evaporation section. In order to prevent dry-out of coolant, the device comprises a cavity for containing a gaseous coolant which has not been condensed formed on an inside wall of coolant circulation loop adjacent to an evaporation section. The thin-plate-type cooling device comprises a lower plate and an upper plate. The evaporation section may be formed only on the lower plate. In embodiments, one or more first cavities in the upper plate provide the space where the coolant in the gas state which has not been condensed may be contained. The upper plate is formed by the same or different material as the lower plate. The one or more cavities prevent the coolant in the gas state which has not been condensed in the condensation section from being bubbles in the coolant in the liquid state.

Capillary action may be achieved by a mesh as is commonly applied in e.g. vapor chambers. The orientation of a vapor chamber is of little importance due to capillary forces providing transportation of coolant also in direction opposite of direction of gravity forces. FIG. 1 illustrates schematically how heat may be spread in various directions from a cross-section view of a vapor chamber. A liquid evaporates in a heat zone (101) and the vapor spreads in the interior (102) of the vapor chamber and hits the walls covered by a wick structure lining (103) where the vapor condenses and is transports in direction towards the heat zone by capillary forces.

FIG. 2 illustrates schematically a two-layer mesh (201), (202) of a wick structure having different pore sizes of the first (201) and second (202) layers.

US Patent Application US20020062648 discloses an apparatus for dense chip packaging using heat pipes. A vapor travels to the condenser region via vapor channels and is condensed to a fluid once again by transferring heat from the vapor to a heat sink. The condensed fluid is then returned to the evaporator region by way of capillary forces and capillaries formed in a capillary structure. The capillaries formed in the capillary structure have tree-like or fractal geometry.

Using of imbedded channels or comprising heat pipes of prior art requires a complicated manufacturing process and a number of channels, thus causing a high price for the final prior art product due to material price and the manufacturing process.

A thermo siphon with a heat sink has a better temperature distribution than just a heat sink but it is in prior art also a complicated and quite expensive unit.

SUMMARY OF THE INVENTION

Problems

With known cooling devices using thermo siphon technology there is a high cost to manufacture the different components of the thermo siphon, which are channels, evaporator and heat sink. It is also a complicated and expensive process to manufacture the cooling device from its different components.

It is also a problem that the heat flow from the heat load goes via channel walls to cooling agent and then again from cooling agent via the channel wall to the heat sink. The thermal resistance between the channel and heat sink causes additional thermal resistance, resulting in additional temperature rise on hot spots. It is thus a problem to optimise the heat flow through the thermo siphon by minimising the thermal resistance of the thermo siphon.

It is also a problem that a thermo siphon requires a temperature in the evaporator not being less than a critical value bringing the cooling agent into a boiling state for effective cooling to start. A cooling device with a thermo siphon will not provide efficient cooling when no boiling occurs in the thermo siphon.

A problem with devices comprising a wick structure relying upon capillary forces for the circulation, such as vapor chambers, is due to the fact that the wick structure may provide a hydraulic resistance that translates to a thermal resistance of the circulation loop. As noted in prior art, poor circulation may result in exhaustion of liquid in the heat zone and dramatically reducing heat spreading capacity of the cooling device, with an apparent risk of failure of, e.g. electronics in need of cooling.

High thermal resistance of, e.g., a vapor chamber results in a limited temperature difference, $\Delta T$, between evaporation zone and condensation zone, thereby limiting cooling capacity.

The limited temperature difference and high internal resistance also makes it difficult to scale heat transporting capability of vapor chambers for spreading of more heat from greater heat power sources, such as power amplifiers.

Another problem of prior art is also associated with thermal resistance. In prior art electronic components are frequently mounted on a heat sink in the form of a metal plate, e.g. by soldering or screwing, the metal plate then being mounted on a heat spreading device. The intermediary heat sink/metal plate and the transitions component-heat sink and heat sink-heat spreading device provides thermal resistance.

Solution

With the purpose of solving one or more of prior art problems, and from the standpoint of a cooling device with a thermo siphon comprising a first chamber, here called an evaporator, a second chamber, here called a condenser, a first conduit, here called a riser, from the evaporator to the condenser, and a second conduit, here called a downcomer, from the condenser to the evaporator, the present invention teaches that the evaporator, the condenser, the riser and the downcomer are preferably all integrated within and constitutes one body including all parts.

In an example embodiment of invention, the cooling device comprises a first outer surface of the body in the region of the evaporator, and a second outer surface of the body in the region of the condenser, where the first surface is adapted to make a good thermal contact with a heat load source, and where the second surface is adapted to dissipate heat. The first surface can be made flat to make thermal contact with a flat heat load source, such as an integrated circuit, and the second surface can have an enlarged surface area, such as radiating fins or ribs.

For the purpose of providing a large surface area to evaporator and condenser an embodied evaporator comprises a number of conduits that leads to the riser, and an embodied condenser comprises a number of conduits that leads to the downcomer.

An example method of manufacturing a cooling device of thermo siphon comprising a first chamber, a second chamber, a first conduit, and a second conduit, comprises:

integrating a single volume formed by a structure within one and the same body, providing a lid over any open part of the structure for closing the structure, thus forming an enclosed volume within the body, the enclosed volume with its structure forming the evaporator, the condenser, the riser and the downcomer.

A further example method comprises providing, e.g. by machining such as milling, a body with an open cavity, the method comprising positioning parting members to form the structure of the single volume, the cavity and the parting members forming an open volume.

Regardless of how the body with its internal open cavity, and with its structure, is provided the method comprises closing of an open part of the volume by a lid, thus forming an enclosed volume integrated within the one body, the enclosed volume with its structure forming the evaporator, the condenser, the riser and the downcomer.

The lid must be closed to the body in a secure manner in order to enclose the volume so that it can withstand the internal pressure that will build up during the use of the cooling device. It is preferred that the method comprises closing the lid to the body by means of, e.g., welding, soldering or an adhesive.

If welding is used then it should be understood that welding can be fusion welding or pressure welding, and that pressure welding can be cold-press welding, friction welding or ultrasonic welding.

Any additional part introduced during the manufacturing process, such as the guiding member or the parting members mentioned in previous embodiments can be attached in the same manner as the attachment of the lid. So for instance if the lid is attached by means of cold-press welding then the guiding member or the parting members can also be attached by means of cold-press welding. This can be done separately or at the same time as the lid is attached. It should however be understood that even if the guiding member or parting members are attached by one method of attachment, the lid might be closed and attached by some other means of attachment.

According to one embodiment, the heat spreading device is made out of an extruded body, where the extruded body comprises a number of internally enclosed conduits formed in the extrusion process. The making corresponds to an example method of manufacturing.

Example integral parts/portions are provided, such as cavities, barrier and fins.

An example method of manufacturing in accordance with the invention is disclosed.

Example Advantages

An example device according to the invention having at least condensation and transportation zones, and preferably also evaporation zone, reduced of thermal resistance, e.g. from a mesh provides greater scaling capability, facilitates greater $\Delta T$ and greater heat spreading and thereby cooling capacity.

Example embodiments of the invention reduces dramatically the risk of dry-out of liquid as compared to, e.g., vapor chambers, which risk of liquid exhaustion can be substantially eliminated by careful adaptation of size of device, amount of liquid and specified cooling capability and operating temperature and pressure.

An example device in accordance with the invention spreading heat in effectively a single direction reduces the risk of spreading heat from one heat sensitive component to another but facilitates heat spreading in a desired direction of enhanced cooling, e.g. by fins or just a radiating region free from heat sensitive components.

Preferred embodiments of the invention provides scalability and facilitates increasing cooling capacity/heat transport capacity by increasing size of the heat spreading device.

Example embodiments integrating the metal plate of a traditional heat sink and a heat spreading device, such as a thermo siphon, substantially reduce the thermal resistance between the electronic component and the heat spreading device.

A manufacturing method according to the present invention provides a simple and cost effective way of manufacturing a cooling device with a thermo siphon. Integrated various one or more parts of a thermo siphon, provide low manufacturing cost and a very simple, and thus cost effective, manufacturing process.

A cooling device with a low thermal resistance provides a temperature efficient cooling device with an effective heat flow from the heat load to the heat sink. The best possible cooling capacity is achieved due to a uniform temperature distribution at the heat sink. The lowest possible increase of temperature between the contact surface for the heat source and ambient air is achieved because the cooling agent has direct contact with the actual hot spot of the evaporator and with the actual heat dissipating part of the condenser.

Integrating the thermo siphon within the body of a cooling device also provides a cooling device with two possible operational modes; an active mode with a two phase thermo siphon and a passive mode when no boiling occur inside of the thermo siphon since the single body functions as a passive heat sink during the passive mode, thus providing unique thermal/cooling control possibilities with stable temperature distribution on electronics components at different ambient temperatures.

Compared to cited prior art solutions, a cooling device in accordance with the invention will decrease the cost for used cooling system or increase cooling capacity of the cooling system, thus making it feasible as cost effective and compact cooling solution. Better cooling systems provide longer life time of the cooled components.

DETAILED DESCRIPTIONS OF THE EMBODIMENTS OF THE INVENTION

Basically, the concept of thermosiphon refers to passive heat exchange based on natural convection which circulates liquid without the necessity of a mechanical pump. This circulation can either be open-loop, or closed-loop circuit with return to the original vessel. The use of natural convection simplifies the pumping of liquid and/or heat transfer, and avoids the cost and complexity of a liquid pump. In this specification a closed-loop circuit is considered. The basic thermosiphon concept may refer to heat exchange by a medium in a single phase, the liquid phase. However, as applied in this specification, the concept of thermosiphon is not limited to a single phase. On the contrary, it is noted that effective heat spreading may be enhanced of a thermosiphon heat spreading device if the circulation involves a phase transition, and consequently the loop comprising two phases, a liquid phase and a gaseous phase. Also the basic thermosiphon concept may refer to a liquid of a closed-loop thermosiphon occupying the full volume of the loop comprising the liquid. However, this specification is not limited to a liquid state of a refrigerant completely occupying the volume. Rather, it is observed that weight of a thermo siphon heat spreading device may be reduced by reducing amount of liquid. Depending on refrigerant applied, this may also significantly impact cost of device, while still providing good or excellent heat spreading capability.

Figure 1:
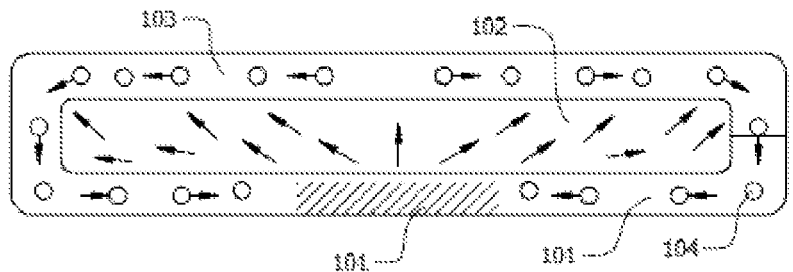
FIG. 1 illustrates schematically how heat may be spread in various directions from a cross-section view of a vapor chamber of prior art.
Figure 2:
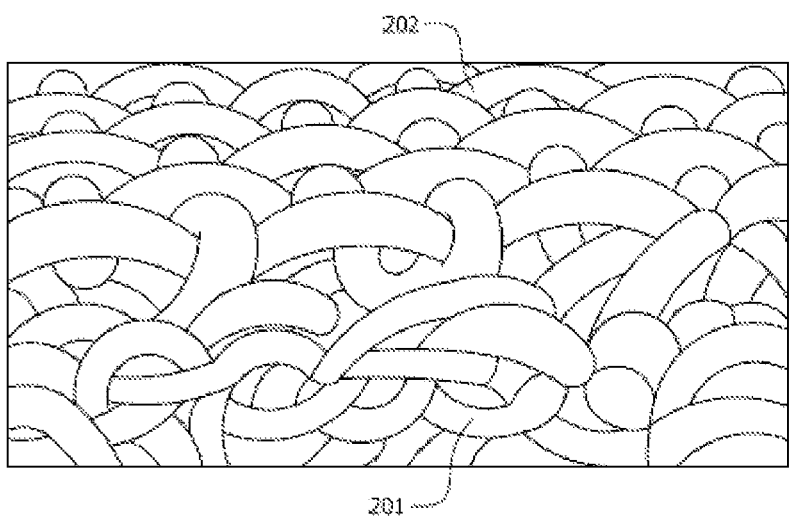
FIG. 2 illustrates schematically a two-layer mesh of prior art technology.
Figure 3:
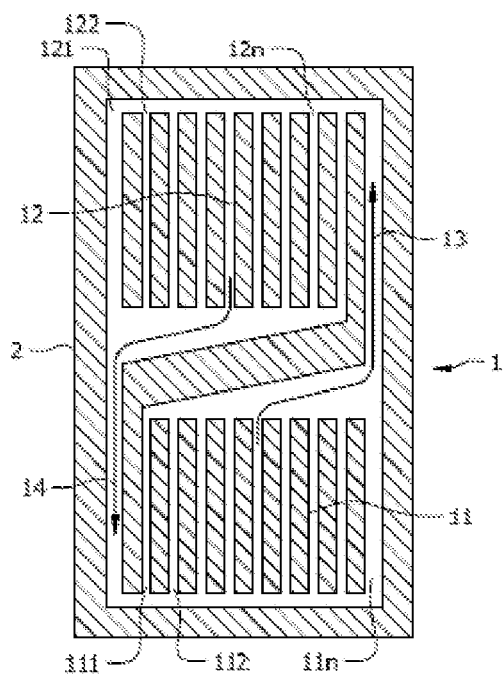
FIG. 3 is a schematic illustration of a thermo siphon in a cooling device according to an embodiment of the present invention.

With reference to FIG. 3, an example cooling device according to the present invention will now be described in more detail.

This figure shows a cooling device with a thermo siphon 1 comprising a first chamber, here called an evaporator 11, a second chamber, here called a condenser 12, a first conduit, here called a riser 13, from the evaporator 11 to the condenser 12, and a second conduit, here called a downcomer 14, from the condenser 12 to the evaporator 11.

Electronics components to be cooled are pressed to a first outer surface 21 (see FIG. 4) in the region of the evaporator 11 to minimize thermal resistance between components and cooling device. Inside the thermo siphon there is a cooling agent and heat from the electronics components results in boiling of the cooling agent inside of the evaporator 11. The boiling results in vapour coming up to riser 13 leading to the condenser 12. Through a second outer surface 22 (see FIG. 4) in the region of the condenser 12 heat will dissipate to the surrounding air and the vapor will condense to liquid. The liquid cooling agent is collected and comes back to the evaporator 11 through the downcomer 14 to continue to take part in the heat and mass transfer as in other well known thermo siphon configurations.

The embodied present invention specifically teaches that the evaporator 11, the condenser 12, the riser 13 and the downcomer 14 are all parts of the device integrated within and constituting one body 2 including the parts. Thereby, e.g. temperature increase because of thermal resistance between the heat sink and thermo siphon, normally included for a thermo siphon coupled to a component heat sink, can be reduced or eliminated.

The first surface 21 is adapted to make a good thermal contact with a heat load source, and where the second surface 22 is adapted to dissipate heat. The first surface 21 can be flat to make thermal contact with a flat heat load source, such as an integrated circuit, and the second surface 22 can for instance have an enlarged surface area, such as radiating fins or ribs.

It is proposed that the evaporator 11 comprises a number of conduits or channels 111, 112, ..., 11n that leads to the riser 13, and that the condenser 12 comprises a number of conduits or channels 121, 122, ..., 12n that leads to the downcomer 14, thus providing a large surface area through which the cooling agent can be readily exposed to the evaporator 11 and the condenser 12.

An inventive method of manufacturing a cooling device with a thermo siphon 1 comprising a first chamber, here called an evaporator 11, a second chamber, here called a condenser 12, a first conduit, here called a riser 13, from the evaporator 11 to the condenser 12, and a second conduit, here called a downcomer 14, from the condenser 12 to the evaporator 11, will now be described with reference to FIG. 4.

The inventive method comprises two major steps, being:
  integrating a single volume A formed by a structure B within one and the same body 2,
  providing a lid 3 over any open part 4 of the structure B for closing the structure,
thus forming an enclosed volume A within the body 2, the enclosed volume A with its structure B forming the evaporator 11, the condenser 12, the riser 13 and the downcomer 14, all integrated within and constituting one body including all parts.

In order to enable the filling of a cooling agent into the enclosed volume A it is proposed that the method comprises the steps of:
  leaving at least one opening 5 into the thermo siphon 1, preferably into the evaporator 11, after the lid 3 has closed the structure B,
  filling a cooling agent into the thermo siphon 1 through the opening 5 after closing the structure B, and
  closing the opening 5 after filling in the cooling agent.

Figure 4:
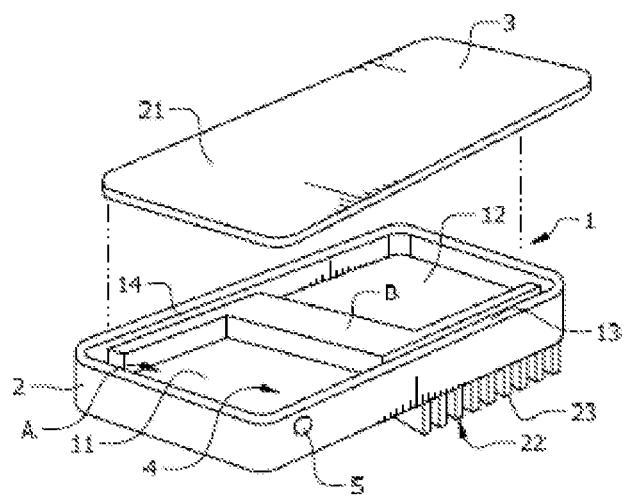
FIG. 4 is a schematic illustration of a thermo siphon manufactured according to an example method of the invention.

After the closing, the structure B of FIG. 4 provides an example closed volume encapsulating sectioning providing chamber and conduit portions as described in relation to FIG. 3.

It is also proposed that the method comprises:
  providing a first outer surface 21 of the body 2 with required properties of making a good thermal contact with a heat load source, and
  providing a second outer surface 22 of the body 2 with required properties for dissipating heat,
  where the first surface 21 is in the region of the evaporator 11, and the second surface 22 is in the region of the condenser 12.

It should be understood that the step of filling the cooling agent might require pumping out air from the thermo siphon, thus making a lower pressure inside he thermo siphon, or even making a vacuum inside the thermo siphon, before filling up the cooling agent depending on what kind of cooling agent that is used.

The first surface 21 can for instance be made flat to enable thermal contact with a flat heat load source, such as an integrated circuit, and the second surface 22 can for instance be provided with an enlarged surface area, such as radiating fins or ribs 23. The first surface may also be adapted, e.g. being provided with threaded holes, bolts or pins, for firm mounting or fixing of one or more electronic components or packages to the flat surface. Example first or second surfaces, preferably extending in a plane, with a solid interior without penetrating holes extends the effective area of the heat spreading device for cooling of electronics while limiting the size of the device.

FIG. 4 shows cooling fins 23 that have a position with a horizontal direction if the cooling device is positioned so that gravity enables the function of the thermo siphon 1. Normally the fins 23 are given a vertical direction to provide conditions for a passive airflow to cool down the fins 23, however if a forced air flow is used then the fins 23 can have any position. It should be understood that the present invention is not limited to how the second outer surface 22 is adapted to good heat dissipation, and if cooling fins or ribs are used, then it is not limited to how these fins or ribs are positioned. The skilled person understands how to position such fins or ribs to achieve good cooling conditions. It should also be understood that surface areas in the regions of other parts of the thermo siphon, such as in the area of the evaporator 11, can also be adapted to heat dissipation, so it is also possible to position fins or ribs 23 in the area of the evaporator 11, even if this is not shown in the figures.

It is also proposed that the evaporator 11 is provided with a number of conduits as shown in FIG. 3, 111, 112, . . . , 11*n* that leads to the riser 13, and that the condenser 12 is provided with a number of conduits 121, 122, . . . , 12*n* that leads to the downcomer 14, thus providing a large surface area to the evaporator and the condenser.

Figure 5A:
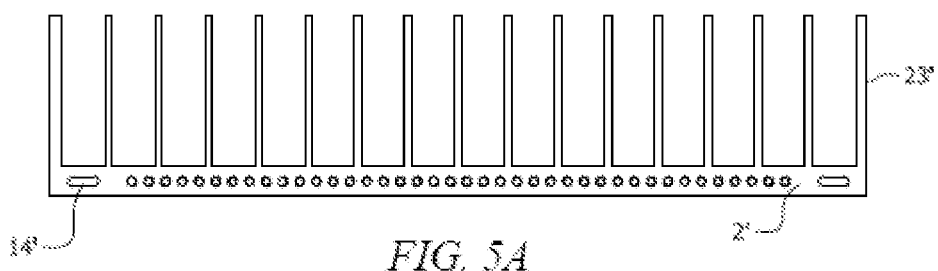
FIGS. 5a and 5b is an illustration of an embodied cooling device according to the invention comprising an extruded body.
Figure 5B:
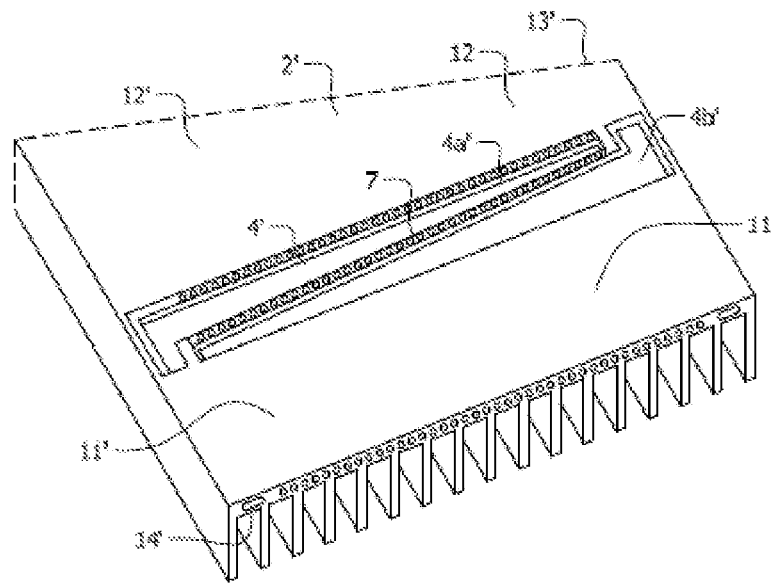

FIG. 5 shows a proposed embodiment where the body is made out of an extruded body 2', FIG. 5*a* showing a cross sectional view of the extruded body, and FIG. 5*b* showing a perspective view of the extruded body.

The extruded body 2' comprises a number of internally enclosed conduits formed in the extrusion process. The extruded body 2' can be dimensioned as a heat sink with optimized fins 23' dimensions The method comprises opening a cavity 4' across the extruded conduits, allowing extruded conduits on a first side 11' of the cavity 4' to lead into the cavity 4' and to form the structure of the evaporator 11, allowing extruded conduits on a second side 12' of the cavity 4' to lead into the cavity 4' and to form the structure of the condenser 12, allowing at least one of the extruded conduits 14' on the first side 11' to originate from the cavity 4' and to form the structure of the downcomer 14, allowing at least one of the extruded conduits 13' on the second side 12' to originate from the cavity 4' and to form the structure of the riser 13, and allowing the cavity 4' to form an interfacing area between the evaporator 11 and the condenser 12.

Figure 6A:
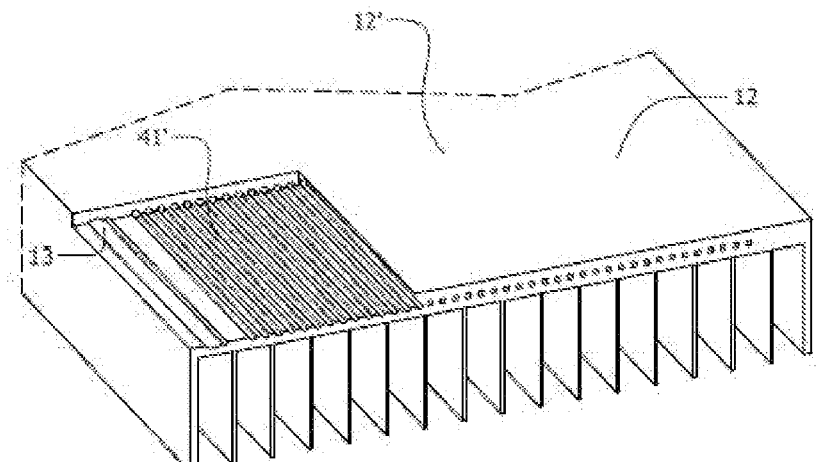
FIGS. 6a and 6b demonstrates details from an example manufacturing process according to the invention using an extruded body for making the cooling device.
Figure 6B:
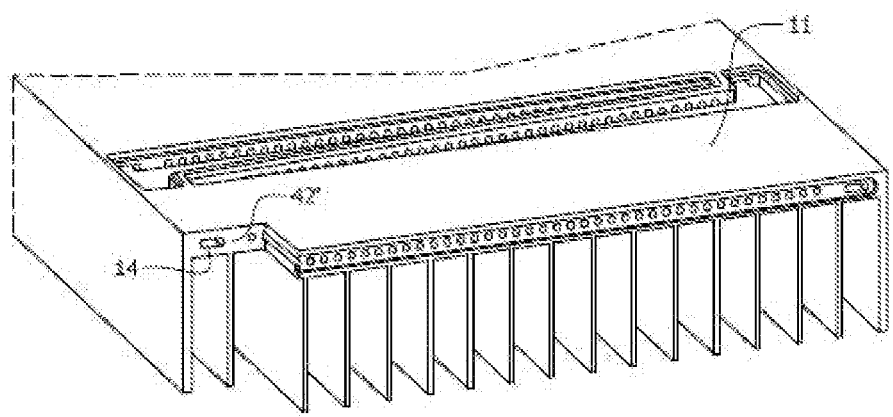

The cavity can be opened by milling (machine treatment), thus making required holes or cavities in the extruded body 2' as shown in FIG. 5*b*. FIG. 6*a* shows a detail of the first side 11' and FIG. 6*b* shows a detail of the second side 12'. Here it is illustrated that outer cavities 41', 42' can be opened in the outer parts of the extruded body 2', where a first outer cavity 41' provides an opening and a connection between the riser 13 and the condenser 12, and where the second outer cavity 42' provides an opening and a connection between the downcomer 14 and the evaporator 11.

The method further comprises the step of providing a guiding member 7 in the interfacing area, the guiding member 7 forming a barrier between the evaporator 11 and the condenser 12 and a guide from the evaporator 11 to the riser 13 and from the condenser 12 to the downcomer 14, the interfacing area forming an open part 4 of the single volume A. The guiding member 7 can be provided in the milling process by making two cavities 4*a*', 4*b*' serving as collectors preferably being provided adjacent to each other, separated by a guiding member 7 in between. In this case, it is required that the extruded conduits that are penetrating the guiding member 7 are sealed to form the barrier. The collector portions are preferably tapered. With an integrated structure, this may be achieved without increase of space requirements or cost of material of the heat spreading device due to symmetries. If two cavities 4*a*', 4*b*' are made then either one or two lids can be used to close the cavities. This lid or these lids can be formed to also seal the guiding member in the closing process. The guiding member 7 can also be sealed through welding.

The guiding member 7 can also be provided through a separate part which is added into the cavity 4' to form the barrier in the interfacing area.

The next step of the method is to close the outer cavities 41', 42' of the extruded body 2' so that the riser 12 will lead into a closed condenser 13, and so that the downcomer 14 will lead into a closed evaporator 11.

If for instance cold press welding is used to attach the lid then it is possible to attach the guiding member 7 to the interfacing area with the same attachment method as is used to attach the lid to the body.

Figure 7A:
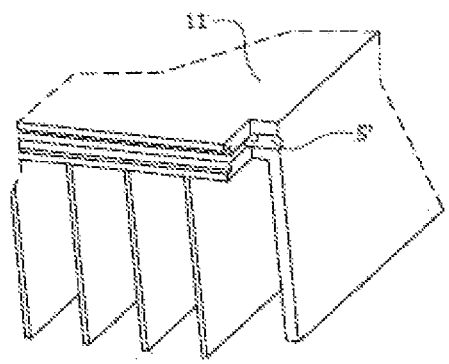
FIGS. 7a and 7b are illustrates example provision of a hole in accordance with the invention for filling of cooling agent.
Figure 7B:
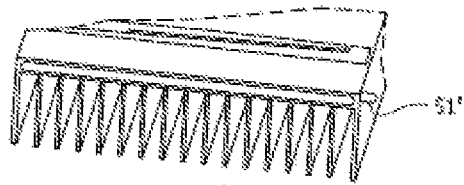

FIG. 7a shows that a hole can be drilled into the evaporator 11 in order to provide an opening 5' for the filling of a cooling agent. In order to make the filling process easier it is also possible to weld an aluminium pipe 51', shown in FIG. 7b, into the hole 5'.

After the closing of the lid the evaporator is filled up with an appropriate cooling agent, for instance methanol, benzol, butane, or R134A, optimised for the application that the cooling device will be used in.

Figure 8:
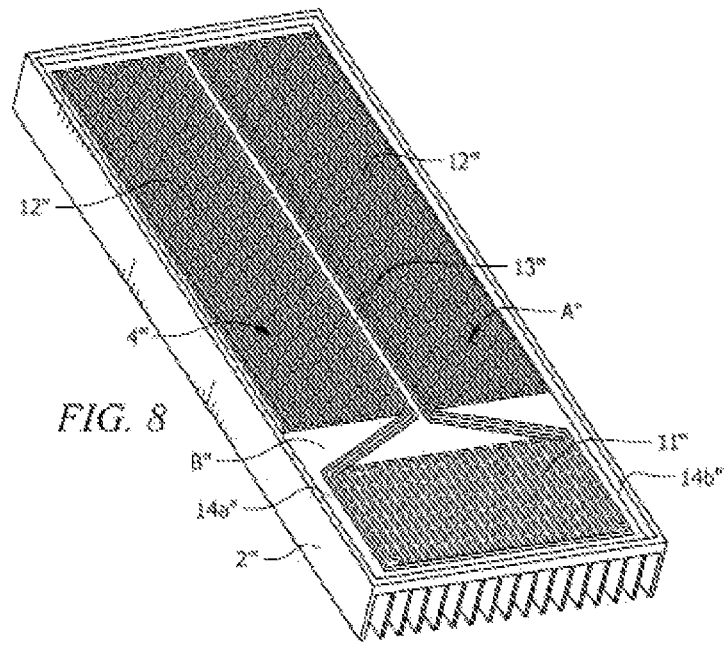
FIG. 8 is a schematic illustration of an embodiment comprising a body obtained by die-casting in the manufacturing process.

Another proposed embodiment of a method to manufacture a cooling device will now be described with reference to FIG. 8, this method comprising die-casting a body 2" forming the integrated single volume A" by a structure B" within the body 2", the die-casting process leaving an open part 4" of the single volume A".

By die casting it is possible to provide a body 2" with an integrated structure B" forming channels that provides the evaporator 11", the condenser 12", the riser 13", and the downcomer. In the exemplifying structure B" shown in the figure a central riser 13" and two separate downcomers 14a", 14b" are formed.

These channels are very easy to manufacture. The open part 4" is covered by a lid (not shown), which is attached by for instance friction welding.

Figure 9A:
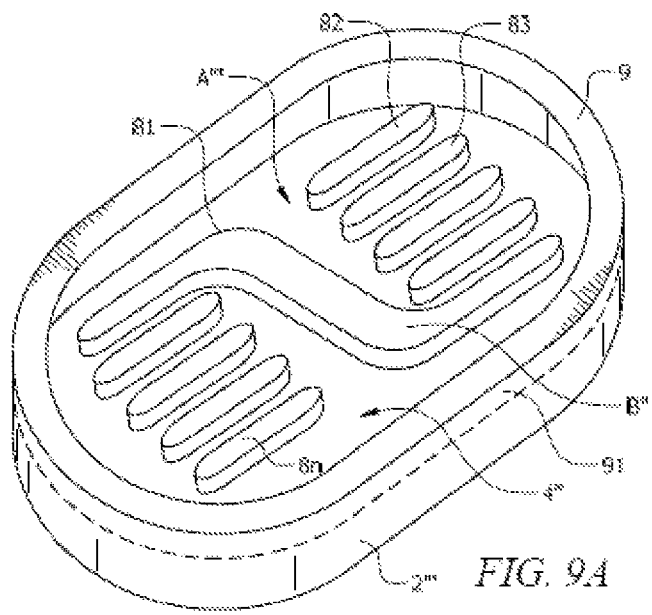
FIGS. 9a and 9b are schematic illustrations of an example embodiment comprising a body with an open cavity during a manufacturing process in accordance with the invention.
Figure 9B:
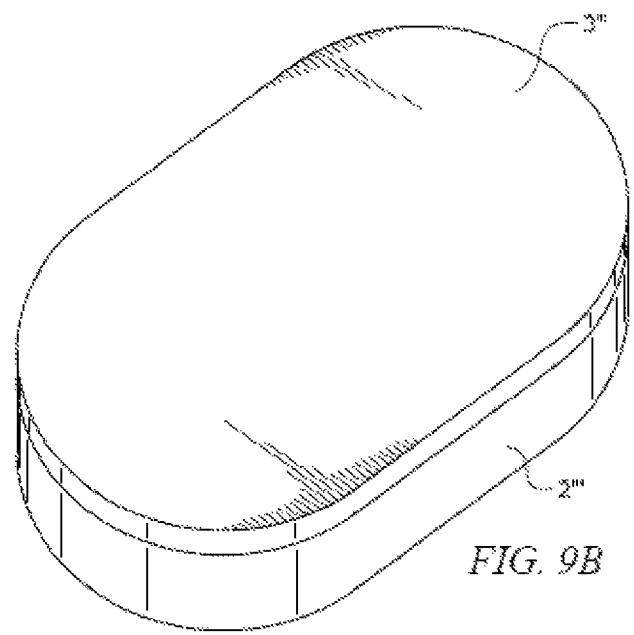

Another proposed embodiment of an inventive method, schematically illustrated in FIG. 9, starts with a body 2''' with an open cavity 4'''. This method comprises positioning parting members 81, 82, 83, . . . , 8n to form the structure B''' of the single volume A''', the cavity 4''' and the parting members 81, 82, 83, . . . , 8n forming an open single volume A'''. FIG. 9b shows schematically that the open volume is closed by a lid 3''', thus forming an enclosed single volume within the body 2'''.

It is proposed that the same means of attachment is used for attaching both the parting members 81, 82, 83, . . . , 8n to the cavity 4''' and the lid 3''' to the body 2'''.

It should be mentioned that it is possible to start with a flat body 2''' and to provide the edge 9 defining the open cavity 4''' as a separate edge member 91, attached to the body in the same way as the parting members 81, 82, 83, . . . , 8n.

Regardless of embodiment, the open part of the single volume is closed by a lid, thus forming an enclosed volume integrated within the body, the enclosed volume with its structure forming the evaporator, the condenser, the riser and the downcomer.

Figure 10:
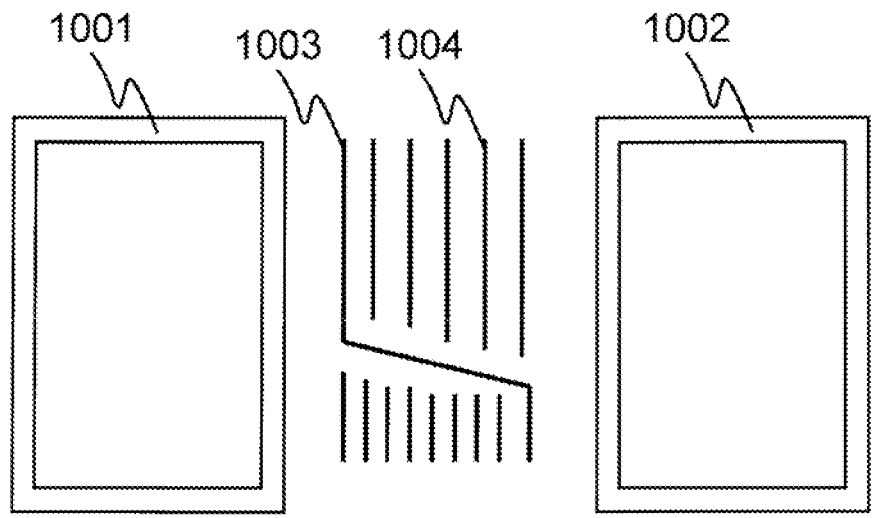
FIG. 10 illustrates example basic elements of an embodiment of the invention made out of metal plates and metal sticks.
Figure 11:
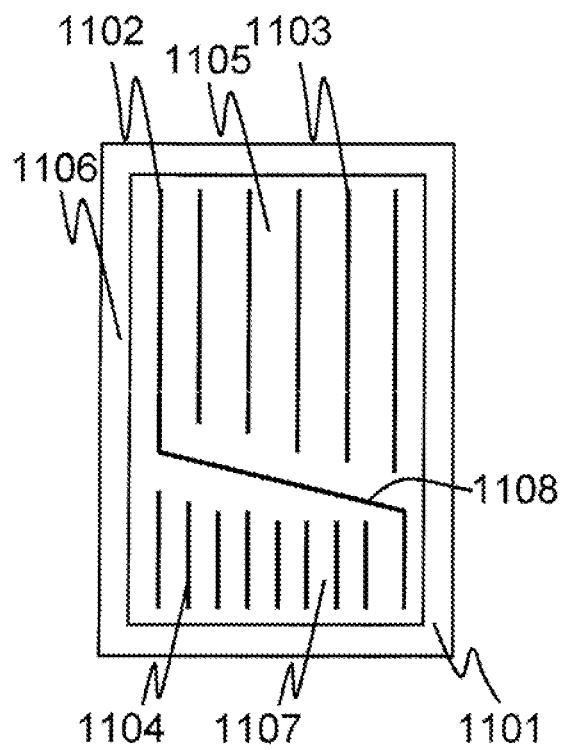
FIG. 11 illustrates the example metal sticks of FIG. 10 as positioned on one of the metal plates during assembly.
Figure 12:
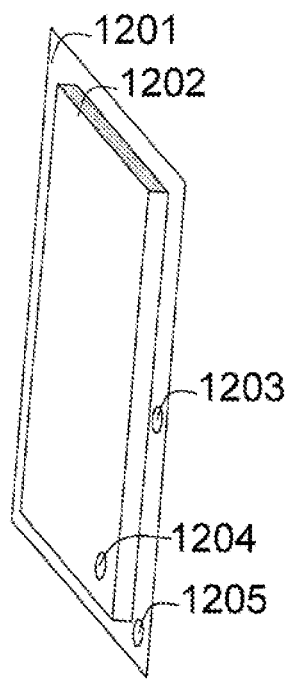
FIG. 12 schematically illustrates example plates as connected according to an embodiment of the invention.

One example of a method of manufacturing can be to use plates, such as two copper or aluminum plates, with a structure in or between both plates, one plate serving as a lid to cover the other plate. The two plates are connected together by for instance high pressure diffuse welding or other type of welding as described above, and a thermo siphon is thus formed through the structure in the two plates in the body made by the two connected plates. One plate can be adapted a good thermal contact with a heat load source and the other plate can be adapted to heat dissipation, such as having fins or ribs. Where necessary, planar accuracy is enhanced by e.g. machining. For such plates, conduits and barrier separating evaporation and condensation zones are preferably formed by sticks that are merged with the plates under high temperature and pressure during assembly provided made of a same material (aluminum or copper). This does not exclude that e.g. a mesh is applied in the evaporation zone, where it provides little or negligible thermal resistance. FIG. 10 illustrates example basic elements of an embodiment of the invention made out of two plates (1001), (1002) and e.g. metal sticks (1003), (1004) providing the structure forming conduits (1105), (1106), (1107) and barrier (1108) as demonstrated in FIG. 11 illustrating the example metal sticks (1102), (1103), (1104) of FIG. 10 as positioned on one of the metal plates (1101) for assembly. FIG. 12 schematically illustrates example plates as connected according to an embodiment of the invention comprising the structure (not illustrated) in the interior of the enclosure/closed volume formed by the connected plates. Preferably, the plates are connected by welding a frame of the plates, thereby forming a border (1201). Preferably, sectioning and conduits formed by the metal sticks are achieved by welding the metal sticks to the two metal plates encapsulated within an enclosure (1202) forming a closed volume of the device. The closed volume may comprise holes (1203-1205) penetrating the welded border (1203), (1204) or both plates (1205) through the closed volume (1202). In the latter case, sealing is achieved by providing metal rings in the intermediary of the two plates, that are preferably welded to the plates similar to the metal sticks, after which welding a hole may be drilled as known in the art as such.

In the process of attaching the lid to the body, certain details like the barrier which is separating the evaporator and riser from the condenser and downcomer can be welded to the lid in order to secure the ability to withstand the pressure drop between the evaporator and the condenser. The welding of the lid must also secure the ability to withstand the pressure drop between the enclosed thermo siphon and the outside of the cooling device.

The value of such pressure drop depends on what kind of refrigerant will be used and operational temperature. In the case of using methanol, the maximum pressure drop can be up to 2 bar. As an example refrigerant, methanol has the advantages of frequently suitable boiling temperature close 60° C. at reasonable pressures without causing freezing problems of out-door mounted devices. Also e.g. water provides a similar boiling temperature range (60-70° C.) at a reasonable pressures (for water close to 0.5 atmosphere, without need to distinguish bar and atmosphere in this context). Preferably, the liquid occupies a volume corresponding to the evaporator portion of the thermosiphon, not excluding other liquid-fill portions to working as well.

The lid can be attached to the body by any means that will provide sufficient security with regards to pressure drops. Possible examples are welding, soldering or an adhesive.

It should be understood that by welding any kind of welding can be used, such as fusion welding or pressure welding, where pressure welding can be cold-press welding, friction welding or ultrasonic welding.

All proposed embodiments give the same thermal advantages with a low thermal resistance from the first surface, the contact are for the heat load, to the second surface, the heat dissipating area. The inventive methods provide an easy way to implement any thermo siphon configuration with a low manufacturing cost.

The structure can have different configurations and the examples shown in the figures are only exemplifying in order to illustrate the invention, the skilled person understands how different structures can form different kinds of thermo siphon configurations.

Since two phase heat and mass transfer is used inside of the body the temperature distribution over the first surface will be kept quite uniform. This contributes to keeping the hotspots temperature as low as possible during a certain ambient temperature. Choice of cooling agent and initial inside pressure can secure best thermal properties of inventive cooling device and as example when the ambient temperature is lower than 10° C. inside the cooling device no boiling will occur. Heat will be transferred only by heat conductivity in the body and partly in liquid cooling agent. This will make the temperature on the first surface more uniform, which will result in higher product life time.

In brief, some example features and embodiments of the invention are as follows a. A heat spreading device of thermo siphon,
   the device encapsulating sectioning forming
      a first chamber portion,
      a second chamber portion,
      a first conduit portion, and
      a second conduit portion,
         the encapsulated sectioning providing interconnection of the first and
      second chamber portions by the first and second conduit portions, and
         the first and second conduit portions occupying volume portions of a closed volume including both the first and second chamber portions of the volume formed by integral sectioning of the device within an enclosure providing the closed volume.
b. A heat spreading device as in a, wherein a piece of material provides at least part of a boundary surface of the enclosure of the closed volume, wherein the piece of material provides a boundary surface common to the first and the second chamber portions.
c. A heat spreading device as in c, wherein the piece of material extends in a plane and has a solid interior.
d. A heat spreading device as in c, wherein the piece of material provides a boundary surface of the first and second conduit portions.
e. A heat spreading device as in b, wherein the heat spreading device encapsulates sectioning forming one or more tapered collector portions extending in at least two dimensions in a same plane as the chambers, wherein the one or more collector portions is arranged in the intermediary of the first conduit portion and the first chamber portion or the second conduit portion and the second chamber portion.
f. A heat spreading device as in e, wherein the encapsulated sectioning forming the one or more tapered collector portions provides two adjacent tapered collector portions.
g. A heat spreading device as in b, comprising a first outer surface of the device in the region of the first chamber portion, and a second outer surface of the device in the region of the second chamber portion, where the first surface is adapted to make a good thermal contact with a heat load source, and where the second surface is adapted to dissipate heat.
h. A heat spreading device as in g, wherein the first outer surface is flat to make thermal contact with a flat heat load source, such as an integrated circuit.
i. A heat spreading device as in g, where the second outer surface has an enlarged surface area, such as radiating fins or ribs.
j. A heat spreading device according to any preceding characteristic, wherein the first chamber portion comprises a plurality of channels that lead to the collector or first conduit, or the second chamber portion comprises a number of channels that lead to the second conduit, thus providing a large inner surface area to the first or second chamber portions.
k. A heat spreading device according to any preceding characteristic, wherein the heat spreading device is adapted for cooling of electronic circuitry.
l. A heat spreading device as in k, wherein the arrangement is adapted for co-locating a boundary surface of the first chamber portion and hot-spots of the electronic circuitry.
m. Method of manufacturing a heat spreading device of thermo siphon comprising a first chamber, here called an evaporator, a second chamber, here called a condenser, a first conduit, here called a riser, from the evaporator to the condenser, and a second conduit, here called a downcomer, from the condenser to the evaporator, comprising the steps of:
   integrating a single volume formed by a structure within one and the same body,
   providing a lid over any open part of the structure for closing the structure,
thus forming a closed volume of body, the closed volume with its structure housing the evaporator, the condenser, the riser and the downcomer, all integrated within and constituting one body as encased by an enclosure providing the closed volume.
n. Method as in m comprising:
   leaving at least one opening into the thermo siphon, preferably into the evaporator, after the lid has closed the structure,
   filling a cooling agent into the thermo siphon through the opening after closing the structure, and
   closing the opening after filling in the cooling agent.
o. Method as in m or n comprising:
   providing a first outer surface of the body with required properties of making a good thermal contact with a heat load source, and
   providing a second outer surface of the body with required properties for dissipating heat,
where the first surface is in the region of the evaporator, and the second surface is in the region of the condenser.
p. Method as in o, where the first surface is made flat to enable thermal contact with a flat heat load source, such as an integrated circuit.
q. Method as in o or p, where the second surface is provided with an enlarged surface area, such as radiating fins or ribs.
r. Method as in any of m to q comprising:
   providing the evaporator with a number of conduits that leads to the riser, and
   providing the condenser with a number of conduits that leads to the downcomer,
thus providing a large surface area to the evaporator and the condenser.
s. Method as in any of m to r, where the body is made out of an extruded body, where the extruded body comprises a number of internally enclosed conduits formed in the extrusion process, the method comprising:
   opening a cavity across the extruded conduits, allowing extruded conduits on a first side of the cavity to lead into the cavity and to form the structure of the evaporator, allowing extruded conduits on a second side of the cavity to lead into the cavity and to form the structure of the condenser, allowing at least one of the extruded conduits on the first side to originate from the cavity and to form the structure of the downcomer, allowing at least one of the extruded conduits on the second side to originate from the cavity and to form the structure of the riser, and allowing the cavity to form an interfacing area between the evaporator and the condenser, providing a guiding member in the interfacing area, the guiding member forming a barrier between the evaporator and the condenser and a guide from the evaporator to the riser and from the condenser to the downcomer, the interfacing area forming an open part of the single volume, closing the outer ends of the extruded body so that the riser will lead into a closed condenser, and so that the downcomer will lead into a closed evaporator.

t. Method as in any of m to r comprising die-casting a body forming the integrated single volume by a structure within the body, the die-casting process leaving an open part of the single volume.

u. Method as in any of m to r where the body has an open cavity, comprising positioning parting members to form the structure of the single volume, the cavity and the parting members forming an open single volume.

v. Method as in any of s to u comprising the step of closing the open part of the single volume by the lid, thus forming an enclosed volume integrated within the body, the enclosed volume with its structure forming the evaporator, the condenser, the riser and the downcomer.

w. Method as in v comprising closing the lid to the body by means of welding or soldering, or by means of an adhesive.

x. Method as in w where welding can be fusion welding or pressure welding, and where pressure welding can be cold-press welding, friction welding or ultrasonic welding.

y. Method as in s comprising applying the same means of attachment both for attaching the guiding member or parting members to the interfacing area and for attaching the lid to the body.

z. A cooling device manufactured as in any of m to y.

It will be understood that the invention is not restricted to the described and illustrated exemplifying embodiments thereof and that modifications can be made and non-exclusive features of different embodiments be combined within the scope of the inventive concept as illustrated in the accompanying claims.

What is claimed is:

1. A thermo siphon heat spreading device comprising:
a first chamber portion formed within the thermo siphon heat spreading device;
a second chamber portion formed within the thermo siphon heat spreading device;
a first plurality of channels disposed within the first chamber portion, wherein all of the first plurality of channels are parallel to each other;
a second plurality of channels disposed within the second chamber portion, wherein all of the second plurality of channels are parallel to each other, wherein the first chamber portion and the first plurality of channels form an evaporator, wherein the second chamber portion and the second plurality of channels form a condenser; and
a sectioning structure that is configured to separate the first chamber portion from the second chamber portion such that fluid in a gas phase can be passed from the evaporator to the condenser through a riser which connects the evaporator and the condenser and fluid in a liquid phase can be passed from the condenser to the evaporator through a downcomer which connects the evaporator and the condenser, wherein the sectioning structure has a portion that forms the riser and is adjacent to and parallel to the second plurality of channels, wherein the sectioning structure has another portion that forms the downcomer and is adjacent to and parallel to the first plurality of channels, wherein the riser is the only riser in the thermo siphon heat spreading device, and wherein the downcomer is the only downcomer in the thermo siphon heat spreading device.

2. The thermo siphon heat spreading device according to claim 1, further comprising two plates, wherein the two plates comprise copper or aluminium, and wherein the two plates are connected by welding.

3. The thermo siphon heat spreading device according to claim 1, further comprising fins or ribs on an outer surface of the device.

4. The thermo siphon heat spreading device according to claim 1, further comprising a first outer surface and a second outer surface, wherein the first chamber portion and the second chamber portion are disposed between the first outer surface and the second outer surface, wherein the first outer surface is configured to receive heat from a heat source, and wherein the second outer surface is configured to dissipate the heat.

5. The thermo siphon heat spreading device according to claim 4, wherein the first outer surface and the second outer surface are parallel, wherein the first outer surface is planar, and wherein a portion of the second outer surface comprises fins or ribs.

6. The thermo siphon heat spreading device according to claim 1, further comprising a first outer sidewall and a second outer sidewall, wherein the first outer sidewall and the second outer sidewall are parallel, and wherein the first chamber portion and the second chamber portion are disposed between the first outer sidewall and the second outer sidewall.

7. The thermo siphon heat spreading device according to claim 6, wherein the first plurality of channels, the second plurality of channels, the first conduit, and the second conduit are parallel to the first Outer sidewall and the second outer sidewall.

8. The thermo siphon heat spreading device according to claim 1, further comprising an outer surface, wherein the outer surface comprises a plurality of sides, and wherein only one of the plurality of sides comprises fins or ribs disposed thereon.

9. The thermo siphon heat spreading device according to claim 1, further comprising an aperture extending between an outer surface of the heat spreading device and an inner surface of the evaporator, and wherein the aperture is configured to receive the fluid to fill the heat spreading device.

10. The thermo siphon heat spreading device of claim 1, wherein the heat spreading device comprises a housing formed by a cover portion, a bottom portion, two end walls, and two side walls, and wherein the first plurality of channels and the second plurality of channels are parallel to the two side walls and are perpendicular to the respective two end walls.

11. The thermo siphon heat spreading device of claim 1, wherein the sectioning structure is also configured to guide the fluid in the gas phase from the evaporator to the riser, and to guide the fluid in the liquid phase from the condenser to the downcomer.

12. The thermo siphon heat spreading device of claim 1, wherein the sectioning structure comprises a structure that is positioned substantially in the center of the device, and wherein the structure starts at a middle-left-down corner of the device and extends to and ends at a middle-right-up corner of the device.

13. The thermo siphon heat spreading device of claim 1, wherein the evaporator and the condenser are formed in a block having an extruded profile.

14. A thermo siphon heat spreading device comprising:
an evaporator comprising a first chamber portion and a first plurality of channels, wherein the first chamber portion is formed within the thermo siphon heat spreading device, wherein the first plurality of channels are disposed within the first chamber portion, and wherein all of the first plurality of channels are parallel to each other;
a condenser comprising a second chamber portion and a second plurality of channels, wherein the second chamber portion is formed within the thermo siphon heat spreading device, wherein the second plurality of channels are disposed within the second chamber portion, and wherein all of the second plurality of channels are parallel to each other; and
a sectioning structure that is configured to separate the first chamber portion from the second chamber portion such that fluid in a gas phase can be passed from the evaporator to the condenser through a riser which connects the evaporator and the condenser and fluid in a liquid phase can be passed from the condenser to the evaporator through a downcomer which connects the evaporator and the condenser, wherein the sectioning structure has a portion that forms the riser and is adjacent to and parallel to the second plurality of channels, wherein the sectioning structure has another portion that forms the downcomer and is adjacent to an parallel to the first plurality of channels, wherein the riser is the only riser in the thermo siphon heat spreading device, and wherein the downcomer is the only downcomer in the thermo siphon heat spreading device.

15. The thermo siphon heat spreading device according to claim 14, further comprising a first outer surface and a second outer surface, wherein the first outer surface forms a part of the evaporator and a part of the condenser, and wherein the second outer surface forms another part of the evaporator and another part of the condenser.

16. The thermo siphon heat spreading device according to claim 15, wherein the first outer surface is planar and is configured to receive heat from a heat source, and wherein the second outer surface is configured to dissipate the heat.

17. The thermo siphon heat spreading device according to claim 16, wherein only a portion of the second outer surface that is adjacent to the evaporator comprises ribs or fins disposed thereon.

18. The thermo siphon heat spreading device of claim 14, wherein the riser is formed adjacent to one lateral side of the device, and the downcomer is formed adjacent to the other lateral side of the device.

19. The thereto siphon heat spreading device of claim 14, wherein the sectioning structure comprises a structure that is positioned substantially in the center of the device, and wherein the structure starts at a middle-left-down corner of the device and extends to and ends at a middle-right-up corner of the device.

20. The thermo siphon heat spreading device of claim 14, wherein the evaporator and the condenser are formed in a block having an extruded profile.

* * * * *